(12) United States Patent
Yang et al.

(10) Patent No.: US 8,537,094 B2
(45) Date of Patent: Sep. 17, 2013

(54) SHIFT REGISTER WITH LOW POWER CONSUMPTION AND LIQUID CRYSTAL DISPLAY HAVING THE SAME

(75) Inventors: Yu-Chung Yang, Hsinchu (TW); Yung-Chih Chen, Hsinchu (TW); Chih-Ying Lin, Hsinchu (TW); Kuo-Hua Hsu, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 543 days.

(21) Appl. No.: 12/730,576

(22) Filed: Mar. 24, 2010

(65) Prior Publication Data
US 2011/0234577 A1    Sep. 29, 2011

(51) Int. Cl.
G09G 3/36    (2006.01)
G11C 19/00    (2006.01)

(52) U.S. Cl.
USPC ............................................. 345/100; 377/64

(58) Field of Classification Search
USPC .......................................... 345/100; 377/64
See application file for complete search history.

(56) References Cited

U.S. PATENT DOCUMENTS

| | | | |
|---|---|---|---|
| 7,949,086 B2 | 5/2011 | Tsai et al. | |
| 2003/0189542 A1* | 10/2003 | Lee et al. | 345/93 |
| 2003/0231735 A1* | 12/2003 | Moon et al. | 377/64 |
| 2005/0008114 A1* | 1/2005 | Moon | 377/64 |
| 2007/0035505 A1* | 2/2007 | Lin et al. | 345/100 |
| 2007/0040793 A1* | 2/2007 | Kim et al. | 345/100 |
| 2007/0046327 A1* | 3/2007 | Wei et al. | 326/46 |
| 2007/0070021 A1* | 3/2007 | Ahin et al. | 345/100 |
| 2007/0086558 A1* | 4/2007 | Wei et al. | 377/64 |
| 2007/0164971 A1* | 7/2007 | Chang et al. | 345/100 |
| 2007/0188436 A1* | 8/2007 | Wei et al. | 345/100 |
| 2007/0192659 A1* | 8/2007 | Kang et al. | 714/726 |
| 2007/0195053 A1* | 8/2007 | Tobita et al. | 345/100 |
| 2007/0217563 A1* | 9/2007 | Chang et al. | 377/64 |
| 2007/0296681 A1* | 12/2007 | Kim et al. | 345/100 |
| 2008/0001904 A1* | 1/2008 | Kim et al. | 345/100 |
| 2008/0012816 A1* | 1/2008 | Moon | 345/100 |
| 2008/0048964 A1* | 2/2008 | Chang et al. | 345/98 |
| 2008/0055293 A1* | 3/2008 | Kuo et al. | 345/204 |
| 2008/0056430 A1* | 3/2008 | Chang et al. | 377/64 |
| 2008/0068326 A1* | 3/2008 | Chen et al. | 345/100 |
| 2008/0079682 A1* | 4/2008 | Chang et al. | 345/98 |
| 2008/0080661 A1* | 4/2008 | Tobita | 377/78 |
| 2008/0100560 A1* | 5/2008 | Na et al. | 345/101 |
| 2008/0219401 A1 | 9/2008 | Tobita | |
| 2008/0285705 A1* | 11/2008 | Wei et al. | 377/78 |
| 2009/0256794 A1* | 10/2009 | Jang et al. | 345/100 |

(Continued)

FOREIGN PATENT DOCUMENTS

| | | | |
|---|---|---|---|
| CN | 101042937 | * | 9/2007 |
| CN | 101303895 | * | 11/2008 |

(Continued)

*Primary Examiner* — Adam J Snyder (74) *Attorney, Agent, or Firm* — Morris Manning & Martin LLP; Tim Tingkang Xia, Esq.

(57) ABSTRACT

A shift register comprises a plurality of stages. In one embodiment, each stage includes a first output, a second output, a pull-up circuit electrically coupled between a node and the second output, a pull-up control circuit electrically coupled to the node, a pull-down control circuit electrically coupled between the node and the first output, and a control circuit electrically coupled to the node and the first output.

20 Claims, 5 Drawing Sheets

(56) References Cited

U.S. PATENT DOCUMENTS

| | | | |
|---|---|---|---|
| 2009/0278785 A1* | 11/2009 | Chin-Cheng | 345/100 |
| 2009/0304138 A1* | 12/2009 | Tsai et al. | 377/79 |
| 2009/0304139 A1 | 12/2009 | Tsai et al. | |
| 2010/0054392 A1* | 3/2010 | Chen et al. | 377/79 |
| 2010/0177023 A1* | 7/2010 | Han | 345/76 |
| 2010/0260312 A1* | 10/2010 | Tsai et al. | 377/64 |
| 2012/0044133 A1 | 2/2012 | Nakamizo et al. | |
| 2012/0076256 A1 | 3/2012 | Yonemaru et al. | |

FOREIGN PATENT DOCUMENTS

| | | | |
|---|---|---|---|
| EP | 1918938 A2 | | 5/2008 |
| EP | 2444974 A1 | | 4/2012 |
| KR | 10-0769970 | * | 10/2007 |
| TW | 200802254 | | 1/2008 |
| TW | 200951968 A | | 12/2009 |
| WO | 2010097986 A1 | | 9/2010 |

\* cited by examiner

SHIFT REGISTER WITH LOW POWER CONSUMPTION AND LIQUID CRYSTAL DISPLAY HAVING THE SAME

FIELD OF THE INVENTION

The present invention relates generally to a shift register, and more particularly to a shift register having a plurality of stages connected in serial. Each stage utilizes a thin film transistor that is driven with a DC voltage signal to reduce the dynamical power consumption and improve the reliability of operation of the shift register.

BACKGROUND OF THE INVENTION

A liquid crystal display (LCD) includes an LCD panel formed with liquid crystal cells and pixel elements with each associating with a corresponding liquid crystal cell. These pixel elements are substantially arranged in the form of a matrix having gate lines in rows and data lines in columns. The LCD panel is driven by a driving circuit including a gate driver and a data driver. The gate driver generates a plurality of gate signals (scanning signals) sequentially applied to the gate lines for sequentially turning on the pixel elements row-by-row. The data driver generates a plurality of source signals (data signals), i.e., sequentially sampling image signals, simultaneously applied to the data lines in conjunction with the gate signals applied to the gate lines for aligning states of the liquid crystal cells on the LCD panel to control light transmittance therethrough, thereby displaying an image on the LCD.

In such a driving circuit, a shift register is utilized in the gate driver to generate the plurality of gate signals for sequentially driving the gate lines. To lower down costs, there have been efforts to integrate the shift register and the gate driver into an LCD panel. One of the efforts, for example, is to fabricate the shift register and the gate driver on a glass substrate of the LCD panel, namely, the gate on array (GOA) arrangement, using amorphous silicon (a-Si) thin film transistors (TFTs).

In order to effectively drive the gate lines of the LCD panel, the a-Si TFTs are usually designed with large (channel width) sizes since the mobility of carriers in the a-Si material is very low. However, the larger the a-Si TFTs are, the higher the parasitic capacitance in the a-Si TFTs is, which causes the power consumption in the data lines of the LCD panel to increase substantially.

Therefore, a heretofore unaddressed need exists in the art to address the aforementioned deficiencies and inadequacies.

SUMMARY OF THE INVENTION

The present invention, in one aspect, relates to a shift register. In one embodiment, the shift register includes a plurality of stages, $\{S_n\}$, n=1, 2, ..., N, N being a positive integer. Each stage $S_n$ comprises a first output for outputting a gate signal, G(n), a second output for outputting a stage carry signal, ST(n), a pull-up circuit electrically coupled between a node, Q(n), and the second output, a pull-up control circuit electrically coupled to the node Q(n), a pull-down circuit electrically coupled between the node Q(n) and the first output, a pull-down control circuit electrically coupled between the node Q(n) and the pull-down circuit, and a control circuit electrically coupled between the node Q(n) and the first output. The control circuit includes a transistor having a gate electrically coupled to the node Q(n), a source configured to receive a DC voltage signal, VGH, and a drain electrically coupled to the first output. The pull-up control circuit of the stage $S_n$ is further electrically coupled to the node Q(n−1) and the second output of the stage $S_{n−1}$, and wherein the pull-down circuit of the stage $S_n$ is further electrically coupled to the second output of the stage $S_{n+1}$.

In one embodiment, the pull-up circuit comprises a transistor T21 having a gate electrically coupled to the node Q(n), a source configured to receive one of a plurality of control signals, $\{HCj\}$, j=1, 2, ..., M, M being a positive integer, and a drain electrically coupled to the second output. The pull-up circuit may further comprise a capacitor electrically coupled between the gate and drain of the transistor T21.

In one embodiment, the pull-up control circuit comprises a first transistor T11 having a gate, a source electrically coupled to the second output of the stage $S_{n−1}$ for receiving the stage carry signal ST(n−1) therefrom and a drain electrically coupled to the input node Q(n), and a second transistor T12 having gate electrically coupled to the node Q(n−1) of the stage $S_{n−1}$, a source configured to receive one of a plurality of control signals $\{HCj\}$, and a drain electrically coupled to the gate of the first transistor T11.

In one embodiment, the pull-down control circuit comprises a first pull-down control circuit and a second pull-down control circuit. Each of the first and second pull-down control circuits has a first transistor T51/T61 having a gate configured to receive a first clock signal, LC1 or a second clock signal, LC2, a source electrically coupled to the gate and a drain, a second transistor T52/T62 having a gate electrically coupled to the node Q(n), a source electrically coupled to the drain of the first transistor T51/T61 and a drain configured to receive a supply voltage VSS, a third transistor T53/T63 having a gate electrically coupled to the drain of the first transistor T51/T61, a source electrically coupled to the source of the first transistor T51/T6 and a drain electrically coupled to a node P(n)/K(n), and a four transistor T54/T64 having a gate electrically coupled to the node Q(n), a source electrically coupled to the drain of the third transistor T53/T63 and a drain configured to receive a supply voltage VSS.

In one embodiment, the pull-down circuit comprises having a first pull-down circuit and a second pull-down circuit. The first pull-down circuit includes a first transistor T31 having a gate electrically coupled to the node P(n) of the first pull-down control circuit, a source electrically coupled to the node Q(n) and a drain electrically coupled to the first output; and a second transistor T32 having a gate electrically coupled to the node P(n) of the first pull-down control circuit, a source electrically coupled to the first output and a drain configured to receive the supply voltage VSS. The second pull-down circuit includes a first transistor T41 having a gate electrically coupled to the node K(n) of the second pull-down control circuit, a source electrically coupled to the node Q(n) and a drain electrically coupled to the first output, a second transistor T42 having a gate electrically coupled to the node K(n) of the second pull-down control circuit, a source electrically coupled to the first output and a drain configured to receive the supply voltage VSS, a third transistor T43 having a gate electrically coupled to the second output of the stage $S_{n+1}$, a source electrically coupled to the node Q(n) and a drain configured to receive the supply voltage VSS, and a fourth transistor T44 having a gate electrically coupled to the second output of the stage $S_{n+1}$, a source electrically coupled to the first output and a drain configured to receive the supply voltage VSS.

In another aspect, the present invention relates to a liquid crystal display (LCD) comprising a liquid crystal panel having a plurality of pixels spatially arranged in the form of a matrix, a plurality of scanning lines spatially arranged along a row direction, wherein each two neighboring scanning lines define a pixel row therebetween, and a gate driver adapted for generating a plurality of gate signals for driving the plurality of pixels. The gate driver comprises a shift register having a plurality of stages, $\{S_n\}$, connected in serial, n=1, 2, . . . , N, N being a positive integer.

Each stage $S_n$ comprises a first output electrically coupled a corresponding gate line for outputting a gate signal, G(n), thereto, a second output for outputting a stage carry signal, ST(n), a pull-up circuit electrically coupled between a node, Q(n), and the second output, a pull-up control circuit electrically coupled to the node Q(n), a pull-down circuit electrically coupled between the node Q(n) and the first output, a pull-down control circuit electrically coupled between the node Q(n) and the pull-down circuit, and a control circuit electrically coupled between the node Q(n) and the first output. The control circuit includes a transistor having a gate electrically coupled to the node Q(n), a source configured to receive a DC voltage signal, VGH, and a drain electrically coupled to the first output. The pull-up control circuit of the stage $S_n$ is further electrically coupled to the node Q(n−1) and the second output of the stage $S_{n-1}$, and wherein the pull-down circuit of the stage $S_n$ is further electrically coupled to the second output of the stage $S_{n+1}$.

In one embodiment, the pull-up circuit comprises a transistor T21 having a gate electrically coupled to the node Q(n), a source configured to receive one of a plurality of control signals, $\{HCj\}$, j=1, 2, . . . , M, M being a positive integer, and a drain electrically coupled to the second output. The pull-up circuit may further comprise a capacitor electrically coupled between the gate and drain of the transistor T21.

In one embodiment, the pull-up control circuit comprises a first transistor T11 having a gate, a source electrically coupled to the second output of the stage $S_{n-1}$ for receiving the stage carry signal ST(n−1) therefrom and a drain electrically coupled to the input node Q(n), and a second transistor T12 having gate electrically coupled to the node Q(n−1) of the stage $S_{n-1}$, a source configured to receive one of a plurality of control signals $\{HCj\}$, and a drain electrically coupled to the gate of the first transistor T11.

In one embodiment, the pull-down control circuit comprises a first pull-down control circuit and a second pull-down control circuit. Each of the first and second pull-down control circuits has a first transistor T51/T61 having a gate configured to receive a first clock signal, LC1 or a second clock signal, LC2, a source electrically coupled to the gate and a drain, a second transistor T52/T62 having a gate electrically coupled to the node Q(n), a source electrically coupled to the drain of the first transistor T51/T61 and a drain configured to receive a supply voltage VSS, a third transistor T53/T63 having a gate electrically coupled to the drain of the first transistor T51/T61, a source electrically coupled to the source of the first transistor T51/T6 and a drain electrically coupled to a node P(n)/K(n), and a four transistor T54/T64 having a gate electrically coupled to the node Q(n), a source electrically coupled to the drain of the third transistor T53/T63 and a drain configured to receive a supply voltage VSS.

In one embodiment, the pull-down circuit comprises having a first pull-down circuit and a second pull-down circuit.

The first pull-down circuit includes a first transistor T31 having a gate electrically coupled to the node P(n) of the first pull-down control circuit, a source electrically coupled to the node Q(n) and a drain electrically coupled to the first output; and a second transistor T32 having a gate electrically coupled to the node P(n) of the first pull-down control circuit, a source electrically coupled to the first output and a drain configured to receive the supply voltage VSS.

The second pull-down circuit includes a first transistor T41 having a gate electrically coupled to the node K(n) of the second pull-down control circuit, a source electrically coupled to the node Q(n) and a drain electrically coupled to the first output, a second transistor T42 having a gate electrically coupled to the node K(n) of the second pull-down control circuit, a source electrically coupled to the first output and a drain configured to receive the supply voltage VSS, a third transistor T43 having a gate electrically coupled to the second output of the stage $S_{n+1}$, a source electrically coupled to the node Q(n) and a drain configured to receive the supply voltage VSS, and a fourth transistor T44 having a gate electrically coupled to the second output of the stage $S_{n+1}$, a source electrically coupled to the first output and a drain configured to receive the supply voltage VSS.

In one embodiment, the liquid crystal panel, the plurality of scanning lines and the gate driver are formed on a glass substrate such that the plurality of stage $\{S_n\}$ is located on at least one side of the liquid crystal panel.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-5. In accordance with the purposes of this invention, as embodied and broadly described herein, this invention, in one aspect, relates to a shift register and an LCD using same.

Figure 1:
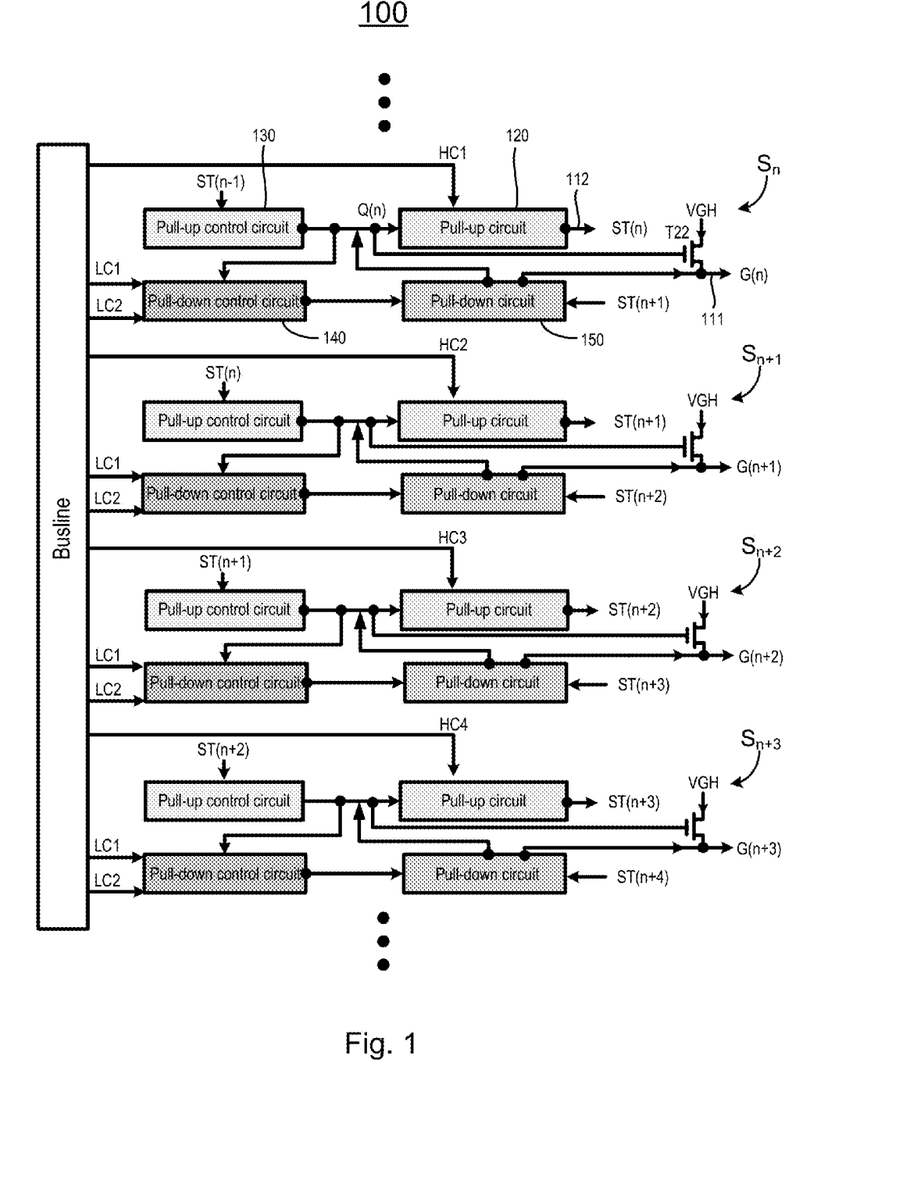
FIG. 1 shows a block diagram of a shift register according to one embodiments of the present invention.

FIG. 1 shows schematically a block diagram (or a GOA architectural layout) of a shift register 100 according to one embodiment of the present invention. The shift register 100 includes multiple stages $\{S_n\}$ connected in serial, n=1, 2, ..., N, N being a positive integer. The multiple stages $\{S_n\}$ are deposited/formed on a glass substrate (not shown). In the exemplary embodiment shown in FIG. 1, only four stages $S_n$, $S_{n+1}$, $S_{n+2}$, and $S_{n+3}$ are shown in the shift register 100.

Each stage $S_n$, has a first output 111 for outputting a gate signal, G(n), and a second output 112 for outputting a stage carry signal, ST(n). The first output of each stage $S_n$, is electrically coupled to a corresponding gate line of an LCD panel (not shown) for outputting the gate driving signal thereto. Each stage $S_n$ also has a plurality of inputs for receiving corresponding one or more control/clock signals, such as LC1, LC2, HC1, HC2, HC3, HC4 and a supply voltage VSS.

Further, each stage $S_n$, has a pull-up control circuit 130, a pull-up circuit 120, a pull-down control circuit 150, a pull-down circuit 140 and a control circuit including a transistor T22 formed on the glass substrate adjacent to each other. For each stage $S_n$, the pull-up circuit 120 is electrically coupled between a node, Q(n), and the second output 112. The pull-up control circuit 130 is electrically coupled to the pull-up circuit 120 through the node Q(n). The pull-down circuit 140 is electrically coupled between the node Q(n) and the first output 111. The pull-down control circuit 150 is electrically coupled between the node Q(n) and the pull-down circuit 140. The pull-up circuit 120 is also configured to receive a corresponding control/clock signal HC1, HC2, HC3 or HC4. For example, the pull-up circuits 120 of the stage $S_n$, $S_{n+1}$, $S_{n+2}$, and $S_{n+3}$ receives the control/clock signals HC1, HC2, HC3 and HC4, respectively, as shown in FIG. 1. The pull-down control circuit 150 is also configured to receive both the control/clock signals LC1 and LC2. The transistor T22 has a gate electrically coupled to the node Q(n), a source configured to receive a DC voltage signal, VGH, and a drain electrically coupled to the first output 111. Additionally, the pull-up control circuit 130 of the stage $S_n$ is also electrically coupled to the node Q(n−1) and the second output 112 of the immediately prior stage $S_{n-1}$. The pull-down circuit 140 of the stage $S_n$ is also electrically coupled to the second output 112 of the immediately next stage $S_{n+1}$.

Figure 2:
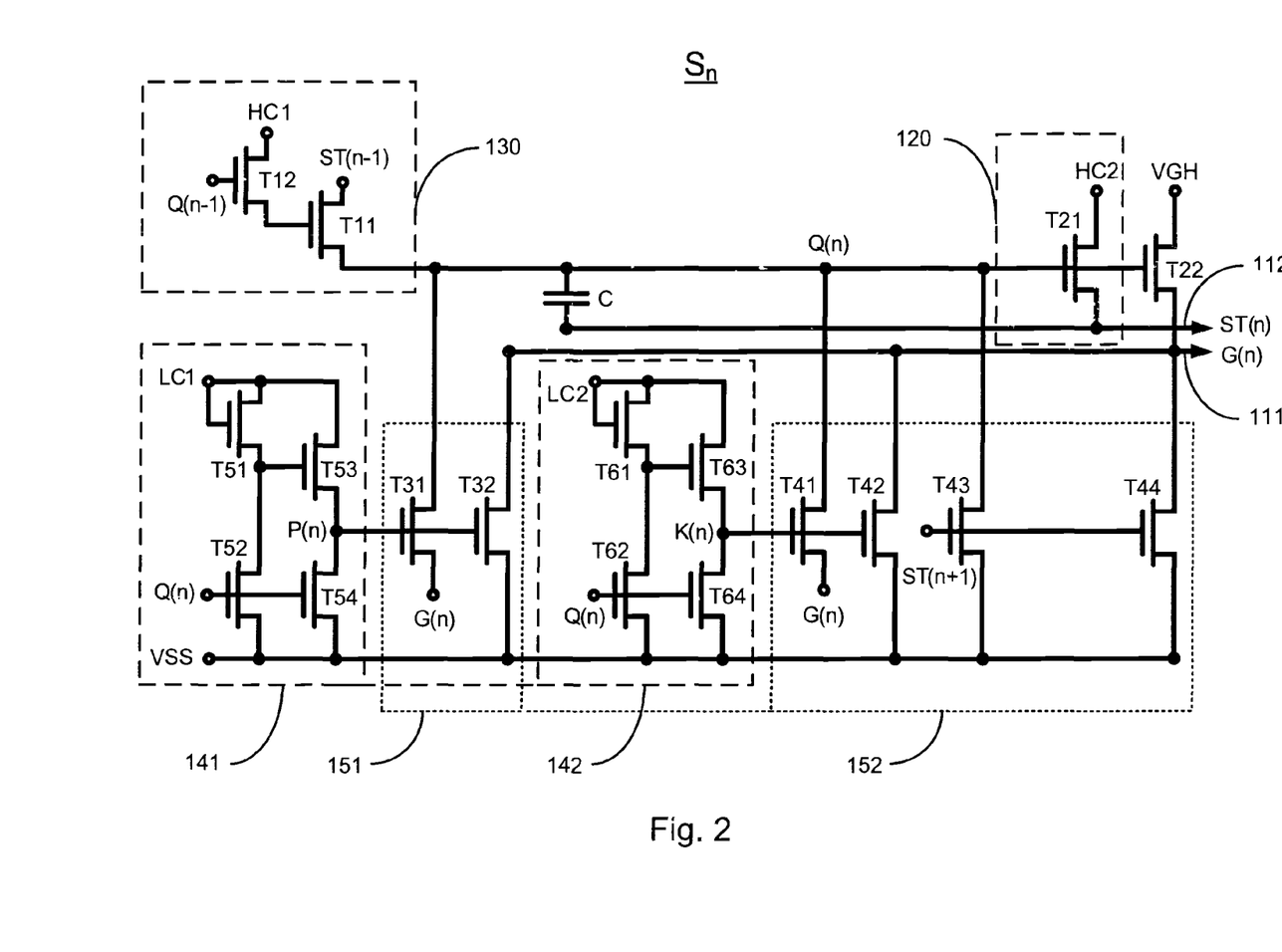
FIG. 2 shows a circuit diagram of the stage $S_n$ of the shift register shown in FIG. 1.

Referring to FIG. 2, a circuit diagram of the stage $S_n$, of the shift register 100 is shown according to one embodiment of the present invention. The pull-up circuit 120 includes a transistor T21 having a gate electrically coupled to the node Q(n), a source configured to receive the control signals HC1, and a drain electrically coupled to the second output 112. The pull-up circuit 120 further includes a capacitor C electrically coupled between the gate and drain of the transistor T21.

The pull-up control circuit 130 includes a first transistor T11 and a second transistor T12. The first transistor T11 has a gate, a source electrically coupled to the second output 112 of the stage $S_{n-1}$ for receiving the stage carry signal ST(n−1) therefrom and a drain electrically coupled to the node Q(n). The second transistor T12 has a gate electrically coupled to the node Q(n−1) of the stage $S_{n-1}$, a source configured to receive the control signal HC4, and a drain electrically coupled to the gate of the first transistor T11.

The pull-down control circuit 140 comprises a first pull-down control circuit 141 and a second pull-down control circuit 142.

The first pull-down control circuits 141 has a first transistor T51 having a gate configured to receive the first clock signal LC1, a source electrically coupled to the gate and a drain, a second transistor T52 having a gate electrically coupled to the node Q(n), a source electrically coupled to the drain of the first transistor T51 and a drain configured to receive the supply voltage VSS, a third transistor T53 having a gate electrically coupled to the drain of the first transistor T51, a source electrically coupled to the source of the first transistor T51 and a drain electrically coupled to a node P(n), and a four transistor T54 having a gate electrically coupled to the node Q(n), a source electrically coupled to the drain of the third transistor T53 and a drain configured to receive a supply voltage VSS.

The second pull-down control circuits 142 has a first transistor T61 having a gate configured to receive the second clock signal LC2, a source electrically coupled to the gate and a drain, a second transistor T62 having a gate electrically coupled to the node Q(n), a source electrically coupled to the drain of the first transistor T61 and a drain configured to receive the supply voltage VSS, a third transistor T63 having a gate electrically coupled to the drain of the first transistor T61, a source electrically coupled to the source of the first transistor T6 and a drain electrically coupled to a node K(n), and a four transistor T64 having a gate electrically coupled to the node Q(n), a source electrically coupled to the drain of the third transistor T63 and a drain configured to receive the supply voltage VSS.

The pull-down circuit 150 includes a first pull-down circuit 151 and a second pull-down circuit 152.

The first pull-down circuit 151 includes a first transistor T31 having a gate electrically coupled to the node P(n) of the first pull-down control circuit, a source electrically coupled to the node Q(n) and a drain electrically coupled to the first output; and a second transistor T32 having a gate electrically coupled to the node P(n) of the first pull-down control circuit, a source electrically coupled to the first output and a drain configured to receive the supply voltage VSS.

The second pull-down circuit 152 includes a first transistor T41 having a gate electrically coupled to the node K(n) of the second pull-down control circuit, a source electrically coupled to the node Q(n) and a drain electrically coupled to the first output, a second transistor T42 having a gate electrically coupled to the node K(n) of the second pull-down control circuit, a source electrically coupled to the first output and a drain configured to receive the supply voltage VSS, a third transistor T43 having a gate electrically coupled to the second output of the stage $S_{n+1}$, a source electrically coupled to the node Q(n) and a drain configured to receive the supply voltage VSS, and a fourth transistor T44 having a gate electrically coupled to the second output of the stage $S_{n+1}$, a source electrically coupled to the first output and a drain configured to receive the supply voltage VSS.

The transistor T22 has a gate electrically coupled to the node Q(n), a source electrically coupled to a DC power source for receiving a high voltage DC signal, VGH, and a drain electrically coupled to the first output 111 for outputting a gate signal to a corresponding gate line to drive pixels associated with the gate line.

The above-disclosed transistors including the transistor T22 are thin film transistors (TFTs), preferably, a-Si TFTs.

For such a configuration of the shift register shown in FIGS. 1 and 2, the transistor T21 of the pull-up circuit 120 is adapted only for pulling up a load potential of the immediately next stage. Thus, the channel width of the transistor T21 can be designed to be very narrow, so that its dynamical power consumption can be negligibly small. Further, the input signal to the transistor T22 is a DC voltage signal, which causes no dynamical power consumption thereof. Accordingly, the overall power consumption of the shift register is reduced substantially.

Figure 3:
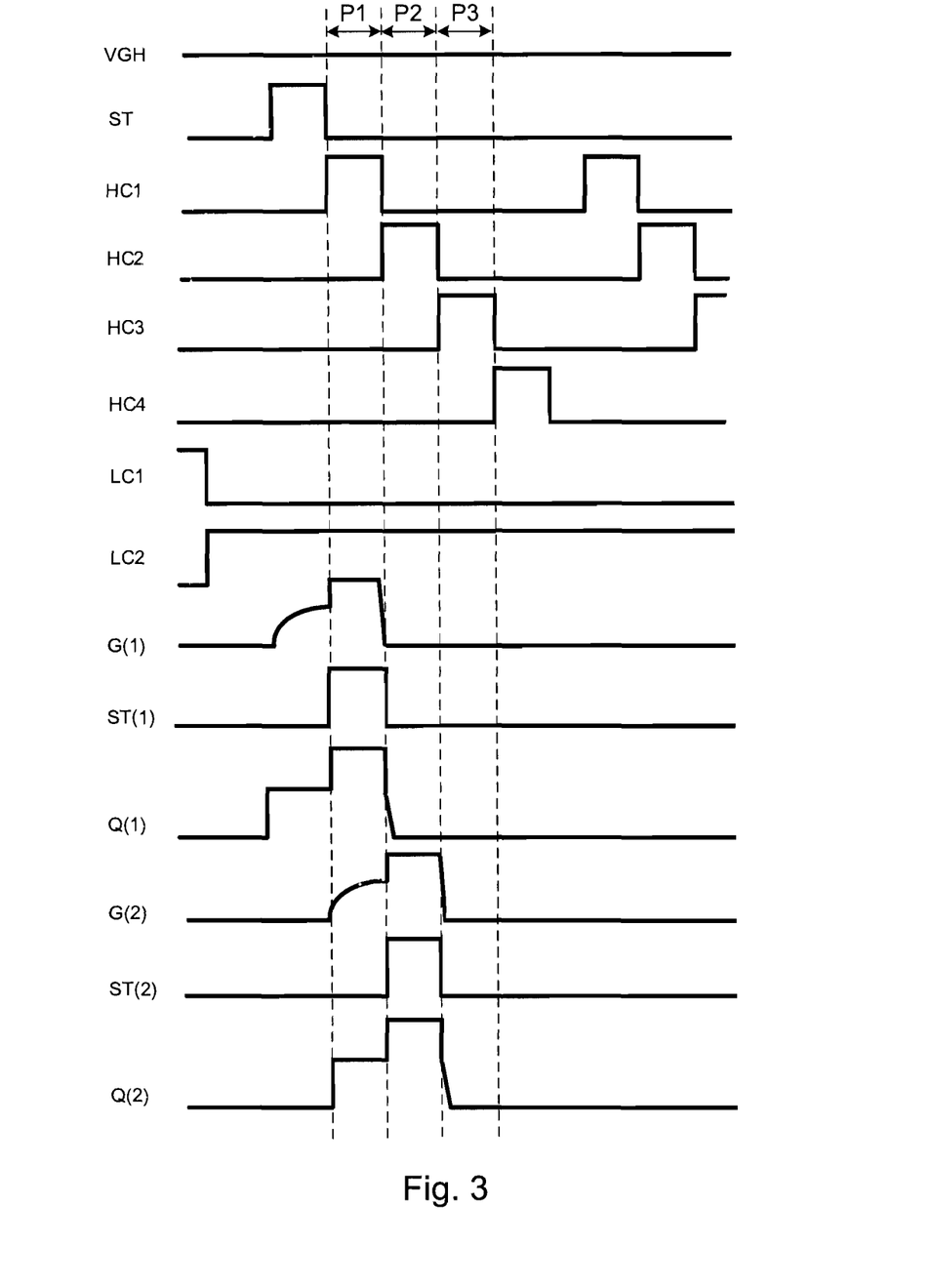
FIG. 3 shows waveforms of signals of the shift register shown in FIG. 1.

FIG. 3 shows waveforms of signals of the second stage $S_2$ (n=2) of the shift register shown in FIGS. 1 and 2, in operation.

During the time period of P1, the voltage (electric potential) of the node Q(1) of the first stage $S_1$ is in a high voltage level, and the transistor T12 is turned on responsively. Accordingly, the gate of the transistor T11 is charged by the first clock signal HC1 and turned on thereby. As a result, the node Q(2) is charged by the stage carry signal ST(1) of the immediately prior stage, $S_1$. When the voltage of the node Q(2) is charged (pulled up) to a high level, so that the transistors T21 and T22 are also turned on. However, during the time period of P1, there is no output of the stage carry signal ST(2), since the second clock signal HC2 coupled to the drain of the transistor T21 is in the low voltage level, VGL. For the transistor T22, there is a current flow from its drain electrically connected to the high voltage level of the DC voltage signal VGH to its source electrically coupled the first output so as to charge the scanning line G(2).

During the time period of P2, when the first clock signal HC1 is in the low voltage level, the transistor T11 is turned off and the node Q(2) is a floating state. Meanwhile, the transistors T21 and T22 are still turned on. When the second clock signal HC2 is in the high voltage level VGH, the stage carry signal ST(2) is output via the transistor T21. The stage carry signal ST(2) coupled with the capacitor C, in turn, charges the node Q(2) to a further higher voltage level. Accordingly, there are a two step rise in the waveform of the node Q(2). When the voltage of the node Q(2) is in the further higher voltage level, the current flow/output from the transistor T22 is larger than that during the time period of P1. Thus, the output voltage at the first output G(2) is higher.

During the time period of P3, when the third clock signal HC3 is in the high voltage level VGH, there is an output of the stage carry signal ST(3) of the next stage $S_3$, which, through the transistor T43, pulls down the voltage level of the node Q(2) to the reference voltage VSS. Meanwhile, the stage carry signal ST(3), through the transistor T44, pulls down the voltage level of the scanning line G(2) to the reference voltage VSS. In the case, the nodes P(2)/K(2) play the role of regulating the voltage level of the nodes Q(2)/G(2). Generally, the voltage level of the nodes Q(2)/G(2), through the transistors T31/T32/T41/T42, are regulated to the reference voltage VSS. However, when there is a contribution of the node Q(2) in the output of this stage, the nodes P(2)/K(2) are pulled down to the reference voltage VSS, so that the regulating circuit is turned off.

The operational principle disclosed above also applies to other stages of the shift register.

Figure 4:
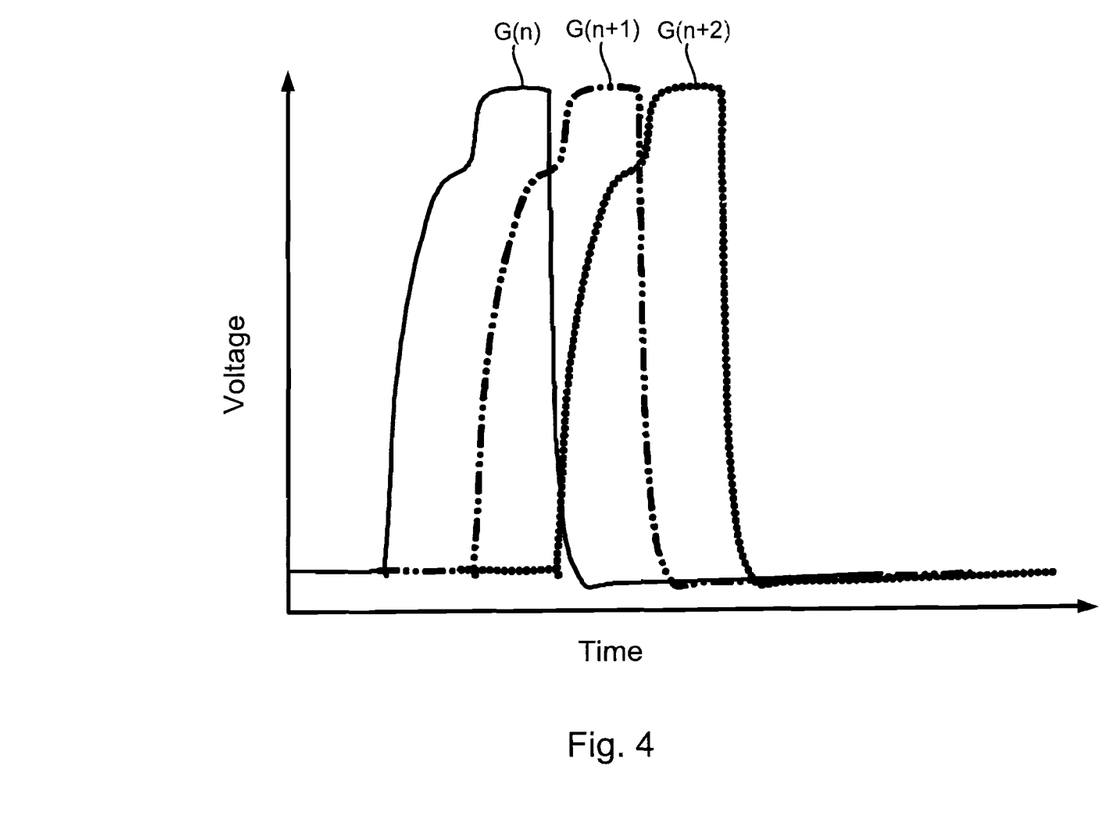
FIG. 4 shows simulated output signals of the shift register shown in FIG. 1.

FIG. 4 shows the simulated waveforms of the output signals G(n), G(n+1) and G(n+2) generated from the stages $S_n$, $S_{n+1}$ and $S_{N+2}$, respectively, of the shift register shown in FIGS. 1 and 2.

Figure 5:
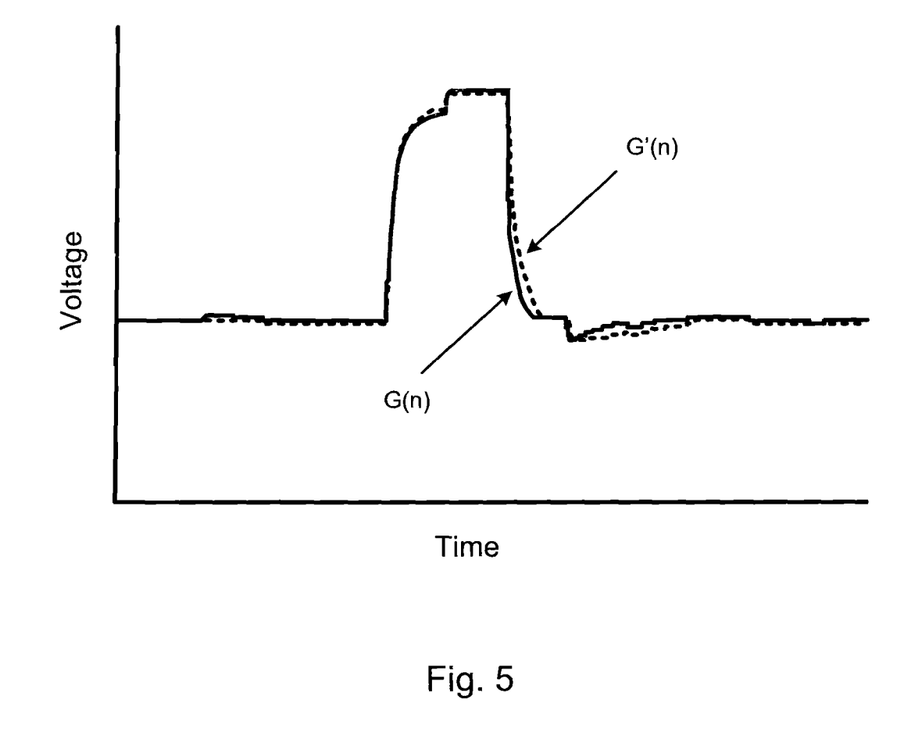
FIG. 5 shows an RA result of output signals of the shift register shown in FIG. 1.

FIG. 5 is an RA testing result for the output signal of the stage $S_n$ of the shift register at the temperature about 100° C. for about 72 hours, where G(n) and G'(n) are corresponding to an initial stage output signal and the stage output signal after the RA testing, respectively. It is shown that according to the present invention, the stage output signal G'(n) after the RA testing is almost identical to the initial stage output signal G(n), indicating that the operation of the shift register is very reliable, and yet consumes much less.

The present invention in another aspect also relates to an LCD using the shift register as disclosed above. In one embodiment, the LCD has a liquid crystal panel having a plurality of pixels spatially arranged in the form of a matrix, a plurality of scanning lines spatially arranged along a row direction, wherein each two neighboring scanning lines define a pixel row therebetween, and a gate driver adapted for generating a plurality of gate signals for driving the plurality of pixels. The gate driver comprises the shift register having the plurality of stages, $\{S_n\}$, connected in serial. The output of each stage $S_n$, is electrically coupled a corresponding gate line for outputting a gate signal, G(n), thereto.

In one embodiment, the liquid crystal panel, the plurality of scanning lines and the gate driver are formed on a glass substrate such that the plurality of stage $\{S_n\}$ is located on one lateral side of the liquid crystal panel, or both lateral sides of the liquid crystal panel. Accordingly, it simplifies the GOA design and reduces the manufacturing cost of an LCD panel. Furthermore, it can reduce the power consumption and improves the reliability of operation of the LCD panel.

In sum, the present invention, among other things, discloses a shift register and an LCD using same. The shift register has plurality of stages connected in serial. Each stage utilizes a thin film transistor that is driven with a DC voltage signal to reduce the dynamical power consumption, and yet improve the reliability of operation.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register, comprising a plurality of stages, $\{S_n\}$, connected in serial, n=1, 2, ..., N, N being a positive integer, wherein each stage $S_n$ comprises:
   (a) a first output for outputting a gate signal, G(n), and a second output for outputting a stage carry signal, ST(n);
   (b) a pull-up circuit electrically coupled between a node, Q(n), and the second output;

9

(c) a pull-up control circuit electrically coupled to the node Q(n);
(d) a pull-down circuit electrically coupled between the node Q(n) and the first output, wherein the pull-down circuit comprises a first pull-down circuit and a second pull-down circuit;
(e) a pull-down control circuit electrically coupled between the node Q(n) and the pull-down circuit, wherein the pull-down control circuit comprises a first pull-down control circuit and a second pull-down control circuit; and
(f) a control circuit electrically coupled between the node Q(n) and the first output;

wherein each of the first and second pull-down control circuits comprises:
 a first transistor T51/T61 having a gate configured to receive a first clock signal, LC1 or a second clock signal, LC2, a source electrically coupled to the gate and a drain;
 a second transistor T52/T62 having a gate electrically coupled to the node Q(n), a source electrically coupled to the drain of the first transistor T51/T61 and a drain configured to receive a supply voltage VSS;
 a third transistor T53/T63 having a gate electrically coupled to the drain of the first transistor T51/T61, a source electrically coupled to the source of the first transistor T51/T61 and a drain electrically coupled to a node P(n)/K(n); and
 a fourth transistor T54/T64 having a gate electrically coupled to the node Q(n), a source electrically coupled to the drain of the third transistor T53/T63 and a drain configured to receive the supply voltage VSS; and wherein the pull-up control circuit of the stage $S_n$ is further electrically coupled to the node Q(n−1) and the second output of the stage $S_{n-1}$, and comprises:
 a first transistor T11 having a gate, a source electrically coupled to the second output of the stage $S_{n-1}$ for receiving the stage carry signal ST(n−1) therefrom and a drain electrically coupled to the input node Q(n); and
 a second transistor T12 having gate electrically coupled to the node Q(n−1) of the stage $S_{n-1}$, a source configured to receive one of a plurality of control signals {HCj}, and a drain electrically coupled to the gate of the first transistor T11.

2. The shift register of claim 1, wherein the pull-down circuit of the stage $S_n$ is further electrically coupled to the second output of the stage $S_{n+1}$.

3. The shift register of claim 2, wherein the pull-up circuit comprises a transistor T21 having a gate electrically coupled to the node Q(n), a source configured to receive one of a plurality of control signals, {HCj}, j=1, 2, . . . , M, M being a positive integer, and a drain electrically coupled to the second output.

4. The shift register of claim 3, wherein the pull-up circuit further comprises a capacitor electrically coupled between the gate and drain of the transistor T21.

5. The shift register of claim 1, wherein the first pull-down circuit comprises:
(a) a first transistor T31 having a gate electrically coupled to the node P(n) of the first pull-down control circuit, a source electrically coupled to the node Q(n) and a drain electrically coupled to the first output; and
(b) a second transistor T32 having a gate electrically coupled to the node P(n) of the first pull-down control

10 circuit, a source electrically coupled to the first output and a drain configured to receive the supply voltage VSS; and wherein the second pull-down circuit comprises:
(i) a first transistor T41 having a gate electrically coupled to the node K(n) of the second pull-down control circuit, a source electrically coupled to the node Q(n) and a drain electrically coupled to the first output; and
(ii) a second transistor T42 having a gate electrically coupled to the node K(n) of the second pull-down control circuit, a source electrically coupled to the first output and a drain configured to receive the supply voltage VSS;
(iii) a third transistor T43 having a gate electrically coupled to the second output of the stage $S_{n+1}$, a source electrically coupled to the node Q(n) and a drain configured to receive the supply voltage VSS; and
(iv) a fourth transistor T44 having a gate electrically coupled to the second output of the stage $S_{n+1}$, a source electrically coupled to the first output and a drain configured to receive the supply voltage VSS.

6. The shift register of claim 1, wherein the control circuit comprises a transistor having a gate electrically coupled to the node Q(n), a source configured to receive a DC voltage signal, VGH, and a drain electrically coupled to the first output.

7. A liquid crystal display (LCD), comprising:
(a) a liquid crystal panel having a plurality of pixels spatially arranged in the form of a matrix;
(b) a plurality of scanning lines spatially arranged along a row direction, wherein each two neighboring scanning lines define a pixel row therebetween; and
(c) a gate driver adapted for generating a plurality of gate signals for driving the plurality of pixels, wherein the gate driver comprises a shift register having a plurality of stages, {$S_n$}, connected in serial, n=1, 2, . . . , N, N being a positive integer, wherein each stage $S_n$ comprises:
 (i) a first output electrically coupled a corresponding gate line for outputting a gate signal, G(n), thereto, and a second output for outputting a stage carry signal, ST(n);
 (ii) a pull-up circuit electrically coupled between a node, Q(n), and the second output;
 (iii) a pull-up control circuit electrically coupled to the node Q(n);
 (iv) a pull-down circuit electrically coupled between the node Q(n) and the first output, wherein the pull-down circuit comprises a first pull-down circuit and a second pull-down circuit;
 (v) a pull-down control circuit electrically coupled between the node Q(n) and the pull-down circuit, wherein the pull-down control circuit comprises a first pull-down control circuit and a second pull-down control circuit; and
 (vi) a control circuit electrically coupled between the node Q(n) and the first output;

wherein each of the first and second pull-down control circuits comprises:
 a first transistor T51/T61 having a gate configured to receive a first clock signal, LC1 or a second clock signal, LC2, a source electrically coupled to the gate and a drain;
 a second transistor T52/T62 having a gate electrically coupled to the node Q(n), a source electrically coupled to the drain of the first transistor T51/T61 and a drain configured to receive a supply voltage VSS;

a third transistor T53/T63 having a gate electrically coupled to the drain of the first transistor T51/T61, a source electrically coupled to the source of the first transistor T51/T61 and a drain electrically coupled to a node P(n)/K(n); and a fourth transistor T54/T64 having a gate electrically coupled to the node Q(n), a source electrically coupled to the drain of the third transistor T53/T63 and a drain configured to receive the supply voltage VSS; and wherein the pull-up control circuit of the stage $S_n$ is further electrically coupled to the node Q(n−1) and the second output of the stage $S_{n-1}$, and comprises:

a first transistor T11 having a gate, a source electrically coupled to the second output of the stage $S_{n-1}$ for receiving the stage carry signal ST(n−1) therefrom and a drain electrically coupled to the input node Q(n); and a second transistor T12 having gate electrically coupled to the node Q(n−1) of the stage $S_{n-1}$, a source configured to receive one of a plurality of control signals {HCj}, and a drain electrically coupled to the gate of the first transistor T11.

8. The LCD of claim 7, wherein the first pull-down circuit comprises:
  (a) a first transistor T31 having a gate electrically coupled to the node P(n) of the first pull-down control circuit, a source electrically coupled to the node Q(n) and a drain electrically coupled to the first output; and
  (b) a second transistor T32 having a gate electrically coupled to the node P(n) of the first pull-down control circuit, a source electrically coupled to the first output and a drain configured to receive the supply voltage VSS; and
  wherein the second pull-down circuit comprises:
    (i) a first transistor T41 having a gate electrically coupled to the node K(n) of the second pull-down control circuit, a source electrically coupled to the node Q(n) and a drain electrically coupled to the first output; and
    (ii) a second transistor T42 having a gate electrically coupled to the node K(n) of the second pull-down control circuit, a source electrically coupled to the first output and a drain configured to receive the supply voltage VSS;
    (iii) a third transistor T43 having a gate electrically coupled to the second output of the stage $S_{n+1}$, a source electrically coupled to the node Q(n) and a drain configured to receive the supply voltage VSS; and
    (iv) a fourth transistor T44 having a gate electrically coupled to the second output of the stage $S_{n+1}$, a source electrically coupled to the first output and a drain configured to receive the supply voltage VSS.

9. The LCD of claim 7, wherein the pull-down circuit of the stage $S_n$ is further electrically coupled to the second output of the stage $S_{n+1}$.

10. The LCD of claim 9, wherein the pull-up circuit comprises a transistor T21 having a gate electrically coupled to the node Q(n), a source configured to receive one of a plurality of control signals, {HCj}, j=1, 2, . . . , M, M being a positive integer, and a drain electrically coupled to the second output.

11. The LCD of claim 10, wherein the pull-up circuit further comprises a capacitor electrically coupled between the gate and drain of the transistor T21.

12. The LCD of claim 7, wherein the liquid crystal panel, the plurality of scanning lines and the gate driver are formed on a glass substrate such that the plurality of stage {$S_n$} is located on at least one side of the liquid crystal panel.

13. The LCD of claim 7, wherein the control circuit comprises a transistor having a gate electrically coupled to the node Q(n), a source configured to receive a DC voltage signal, VGH, and a drain electrically coupled to the first output.

14. A liquid crystal display (LCD), comprising:
  (a) a liquid crystal panel having a plurality of pixels spatially arranged in the form of a matrix;
  (b) a plurality of scanning lines spatially arranged along a row direction, wherein each two neighboring scanning lines define a pixel row therebetween; and
  (c) a gate driver adapted for generating a plurality of gate signals for driving the plurality of pixels, wherein the gate driver comprises a shift register having a plurality of stages, {$S_n$}, connected in serial, n=1, 2, . . . , N, N being a positive integer, wherein each stage $S_n$ comprises:
    (i) a first output for outputting a gate signal, G(n), and a second output for outputting a stage carry signal, ST(n);
    (ii) a pull-up circuit electrically coupled between a node, Q(n), and the second output;
    (iii) a pull-up control circuit electrically coupled to the node Q(n);
    (iv) a pull-down circuit electrically coupled between the node Q(n) and the first output, wherein the pull-down circuit comprises a first pull-down circuit and a second pull-down circuit;
    (v) a pull-down control circuit electrically coupled between the node Q(n) and the pull-down circuit, wherein the pull-down control circuit comprises a first pull-down control circuit and a second pull-down control circuit; and
    (vi) a control circuit electrically coupled between the node Q(n) and the first output;
  wherein the pull-up control circuit of the stage $S_n$ is further electrically coupled to the node Q(n−1) and the second output of the stage $S_{n-1}$, and comprises:
  a first transistor T11 having a gate, a source electrically coupled to the second output of the stage $S_{n-1}$ for receiving the stage carry signal ST(n−1) therefrom and a drain electrically coupled to the input node Q(n); and
  a second transistor T12 having gate electrically coupled to the node Q(n−1) of the stage $S_{n-1}$, a source configured to receive one of a plurality of control signals {HCj}, and a drain electrically coupled to the gate of the first transistor T11.

15. The LCD of claim 14, wherein the pull-up circuit comprises a transistor T21 having a gate electrically coupled to the node Q(n), a source configured to receive one of a plurality of control signals, {HCj}, j=1, 2, . . . , M, M being a positive integer, and a drain electrically coupled to the second output.

16. The LCD of claim 15, wherein the pull-up circuit further comprises a capacitor electrically coupled between the gate and drain of the transistor T21.

17. The LCD of claim 14, wherein the pull-down circuit of the stage $S_n$ is further electrically coupled to the second output of the stage $S_{n+1}$.

18. The LCD of claim 17, wherein each of the first and second pull-down control circuits comprises:
  (a) a first transistor T51/T61 having a gate configured to receive a first clock signal, LC1 or a second clock signal, LC2, a source electrically coupled to the gate and a drain;
  (b) a second transistor T52/T62 having a gate electrically coupled to the node Q(n), a source electrically coupled to the drain of the first transistor T51/T61 and a drain configured to receive a supply voltage VSS;
(c) a third transistor T53/T63 having a gate electrically coupled to the drain of the first transistor T51/T61, a source electrically coupled to the source of the first transistor T51/T61 and a drain electrically coupled to a node P(n)/K(n); and
(d) a four transistor T54/T64 having a gate electrically coupled to the node Q(n), a source electrically coupled to the drain of the third transistor T53/T63 and a drain configured to receive a supply voltage VSS.

19. The LCD of claim 18, wherein the first pull-down circuit comprises:
    a first transistor T31 having a gate electrically coupled to the node P(n) of the first pull-down control circuit, a source electrically coupled to the node Q(n) and a drain electrically coupled to the first output; and
    a second transistor T32 having a gate electrically coupled to the node P(n) of the first pull-down control circuit, a source electrically coupled to the first output and a drain configured to receive the supply voltage VSS; and wherein the second pull-down circuit comprises:
    a first transistor T41 having a gate electrically coupled to the node K(n) of the second pull-down control circuit, a source electrically coupled to the node Q(n) and a drain electrically coupled to the first output; and
    a second transistor T42 having a gate electrically coupled to the node K(n) of the second pull-down control circuit, a source electrically coupled to the first output and a drain configured to receive the supply voltage VSS;
    a third transistor T43 having a gate electrically coupled to the second output of the stage $S_{n+1}$, a source electrically coupled to the node Q(n) and a drain configured to receive the supply voltage VSS; and
    a fourth transistor T44 having a gate electrically coupled to the second output of the stage $S_{n+1}$, a source electrically coupled to the first output and a drain configured to receive the supply voltage VSS.

20. The LCD of claim 14, wherein the control circuit comprises a transistor having a gate electrically coupled to the node Q(n), a source configured to receive a DC voltage signal, VGH, and a drain electrically coupled to the first output.

* * * * *